(12) United States Patent
Cho et al.

(10) Patent No.: US 10,317,712 B2
(45) Date of Patent: Jun. 11, 2019

(54) DISPLAY PANEL AND DISPLAY DEVICE

(71) Applicants: HKC Corporation Limited, Shenzhen (CN); Chongqing HKC Optoelectronics Technology Co., ltd., Chongqing (CN)

(72) Inventors: En-Tsung Cho, Chongqing (CN); Fengyun Yang, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

(*) Notice: Subject to any disclaimer, the term of this patent is extended or adjusted under 35 U.S.C. 154(b) by 0 days.

(21) Appl. No.: 15/848,879

(22) Filed: Dec. 20, 2017

(65) Prior Publication Data

US 2018/0329246 A1 Nov. 15, 2018

Related U.S. Application Data

(63) Continuation of application No. PCT/CN2017/096710, filed on Aug. 10, 2017.

(30) Foreign Application Priority Data

May 12, 2017 (CN) .......................... 2017 1 0333753

(51) Int. Cl.
| | |
|---|---|
| *G02F 1/133* | (2006.01) |
| *H01L 33/20* | (2010.01) |
| *H01L 27/00* | (2006.01) |
| *G02F 1/1362* | (2006.01) |
| *G02F 1/1368* | (2006.01) |
| *H01L 27/144* | (2006.01) |
| *H01L 31/20* | (2006.01) |

(Continued)

(52) U.S. Cl.
CPC ........ *G02F 1/13318* (2013.01); *G02F 1/1368* (2013.01); *G02F 1/136286* (2013.01); *H01L 27/1443* (2013.01); *H01L 31/202* (2013.01); *G02F 2001/13312* (2013.01); *G02F 2202/103* (2013.01); *H01L 29/78669* (2013.01); *H01L 31/1055* (2013.01)

(58) Field of Classification Search
CPC .......... G02F 1/13318; G02F 1/136286; G02F 1/1368; G02F 2001/13312; G02F 2202/103; H01L 27/1443; H01L 27/14609; H01L 27/144; H01L 27/13227; H01L 29/78669; H01L 29/761; H01L 29/124; H01L 31/202; H01L 31/1055; H01L 31/09; H01L 31/18; H01L 31/0352; H01L 31/06; H01L 31/10
See application file for complete search history.

(56) References Cited

U.S. PATENT DOCUMENTS 6,661,027 B1 * 12/2003 Machida ........... H01L 31/03921
257/79
8,450,746 B2 * 5/2013 Chen ................ H01L 27/14658
257/59

(Continued)

*Primary Examiner* — Nikolay K Yushin
(74) *Attorney, Agent, or Firm* — WPAT, PC

(57) ABSTRACT

The present invention discloses a display panel, the manufacturing method of the display panel, and a display device. The display panel comprises a first substrate with a display area and a non-display area, wherein the display area comprises a plurality of transistors, and a light sensor is adjacent to the plurality of transistors.

10 Claims, 2 Drawing Sheets

(51) Int. Cl.
*H01L 29/00* (2006.01)
*H01L 31/105* (2006.01)
*H01L 29/786* (2006.01)

(56) References Cited

U.S. PATENT DOCUMENTS

| | | | | |
|---|---|---|---|---|
| 8,760,409 B2* | 6/2014 | Kinoshita | ............. | G06F 1/3203 |
| | | | | 345/173 |
| 9,007,344 B2* | 4/2015 | Han | ......... | G06F 3/041 |
| | | | | 345/175 |
| 2008/0122804 A1* | 5/2008 | Kinoshita | ............. | G06F 1/3203 |
| | | | | 345/175 |
| 2008/0164481 A1* | 7/2008 | Tai | ........ | G09G 3/3406 |
| | | | | 257/81 |
| 2008/0303022 A1* | 12/2008 | Tai | ............ | H01L 27/14609 |
| | | | | 257/53 |
| 2011/0018815 A1* | 1/2011 | Han | ......... | G06F 3/041 |
| | | | | 345/173 |
| 2013/0037794 A1* | 2/2013 | Chen | ............. | H01L 27/14658 |
| | | | | 257/43 |

* cited by examiner

DISPLAY PANEL AND DISPLAY DEVICE

FIELD OF THE DISCLOSURE

Aspects of the present invention relate to display panel technology field, especially related to a display panel, manufacturing method, and display device thereof.

BACKGROUND

With the development of science and technology and progress, liquid crystal display becomes the mainstream of the display products due to thin body, low power and low radiation. Most of the liquid crystal displays on the market are backlit LCD monitors with LCD panels and backlight modules.

The working theory of liquid crystal panel is placing liquid crystal molecules in two parallel glass substrates and applying a driving voltage to the two glass substrates to control the direction of rotation of the liquid crystal molecules so reflect the light from the backlight module and produce a picture.

Thin Film Transistor-Liquid Crystal Display (TFT-LCD) has gradually dominated the display field due to its low power consumption, excellent picture quality and high production yield. Similarly, the thin film transistor liquid crystal display includes a liquid crystal panel and a backlight module; the liquid crystal panel comprises a Color Filter Substrate (CF Substrate), a thin film transistor substrate (TFT Substrate), and a light mask. There is a transparent electrode on the inner side of the substrate and a layer of liquid crystal molecules (Liquid Crystal, LC) between the two substrates.

With the gradual development of LCD products, people start thinking how to improve LCD with more excellent performance; for example, how to make LCD products adjust according to changes in the external environment.

Additional aspects and/or advantages of the invention will be set forth in part in the description which follows and, in part, will be obvious from the description, or may be learned by practice of the invention. It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

SUMMARY

In view of the above-mentioned drawbacks of the prior art, the technical problem to be solved by the present application is to provide a display panel, a display method and a display device with capabilities of independently adjusting brightness and contrast.

The present invention discloses a display panel, comprising: a first substrate comprising a display area and a non-display area, wherein the display area includes a plurality of transistors and a light sensor adjacent to plurality of transistors; and a second substrate disposed opposite to the first substrate.

The present invention also discloses a display panel manufacturing method, comprising: forming a first substrate and forming a second substrate disposed opposite to the first substrate; forming a plurality of transistors in a display area of the first substrate; and forming a light sensor adjacent to the transistors.

With increasing demand for the display of the actual panel by the viewer, the beneficial effect of the present application is that the application has improved the display panel by making a display panel has a capability of self-regulation. Specifically, since the light sensor is provided correspondingly in the display area of the first substrate, the outside environment of the display area can be sensed by the photosensor, and in particular, it is possible to perceive the change in the intensity of the outside light. In this way, when the light is strong, the monitor can automatically adjust to improve the brightness and enhance the contrast to avoid the display screen is too dark; on weak light, the monitor can automatically adjust to reduce the brightness and reduce the contrast to avoid the picture is too bright; so, the display device can be better, more intelligent adjustment display contrast and display, effectively enhance the audience's viewing experience. Moreover, in this application, the optical sensor is disposed between the intervals of the transistors, so the space efficiency of the substrate can be improved.

The specific embodiments of the present application have been disclosed in detail with reference to the following description and the accompanying drawings, which specify the manner in which the principles of the present application may be employed. It is to be understood that the embodiments of the present application are not limited in scope. In the context of the spirit and terms of the appended claims, the embodiments of the present application include many changes, modifications and equivalents.

The features described and/or illustrated for one embodiment may be used in one or more other embodiments in the same or similar manner, in combination with the features in other embodiments, or in addition to the features in other embodiments.

It is emphasized that the term "comprise/comprising" as used herein refers to the presence of a feature, whole piece, step or component, but does not exclude the presence or addition of one or more other features, integers, steps or components.

BRIEF DESCRIPTION OF THE DRAWINGS

In order to provide a clearer description of the embodiments of the present application or the prior art, the following section briefly describes the drawings used in description of the embodiments or of the prior art. Apparently, the drawings in the following description are merely descriptions of some embodiments of the present application, so one of ordinary skill in the art could obtain drawings of other embodiments without any creative work basing on the following drawings.

DETAILED DESCRIPTION OF PREFERRED EMBODIMENTS

The embodiments are described below in order to explain the present invention by referring to the figures. In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. All other embodiments obtained by those of ordinary skill in the art without making creative work are within the scope of this application, based on the embodiments of the present application.

Figure 1:
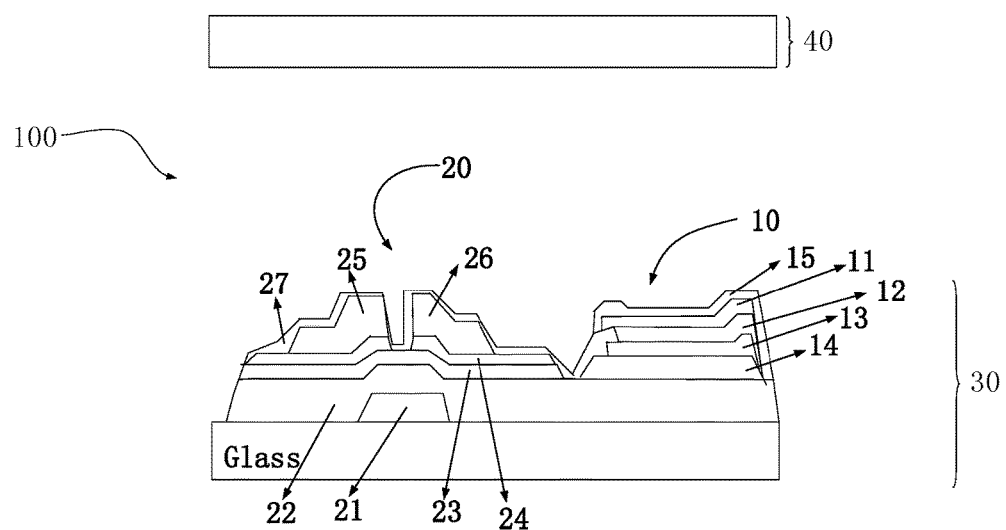
FIG. 1 is a schematic diagram of a display panel in the present application.

Referring to FIG. 1, which is a schematic diagram of a display panel, the present application discloses a display panel 100 which comprises a first substrate 30 and a second substrate 40. The first substrate 30 comprises a display area and a non-display area. The display area comprises a plurality of transistors 20 and a light sensor 10 adjacent to the plurality of transistors 20; the second substrate 40 is disposed opposite to the first substrate 30.

In an embodiment, since the light sensor 10 is provided correspondingly in the display area of the first substrate 30, the outside environment of the display area can be sensed by the light sensor 10, and in particular, it is possible to perceive the change in the intensity of the outside light. In this way, when the light is strong, the monitor can automatically adjust to improve the brightness and enhance the contrast to avoid the display screen is too dark; on weak light, the monitor can automatically adjust to reduce the brightness and reduce the contrast to avoid the picture is too bright; so, the display device can be better, more intelligent to adjust display contrast and to display, effectively enhance the audience's viewing experience. Moreover, in this application, the light sensor 10 is disposed between the transistors 20, that is, disposed in an interval of two adjacent transistors 20 of the plurality of transistors 20, so the space efficiency of the substrate can be improved.

In another embodiment, a transistor 20 of the plurality of transistor 20 comprises a gate 21, a gate insulating layer 22, a transistor amorphous silicon layer 23 (α-Si), and a transistor high-concentration doped N-type amorphous silicon layer (N+α-Si) from bottom to top; the gate insulating layer 22 extends outwardly, and the light sensor 10 is disposed on an extension of the gate insulating layer 22. In this case, the light sensor 10 is provided on the outside of the transistor 20, and the gate insulating layer 22 is used for insulating a spaced apart from the extension to avoid the influence of the electrical signal of the light sensor 10 on the transistor 20; thus, this setting improves the efficiency of space and reduce the waste of space.

Moreover, a data line layer 14 is disposed on the extension of the gate insulating layer 22, the light sensor 10 is disposed on the data line layer 14; the top of the light sensor 10 is covered with a conductive glass layer 15. In this case, the light sensor 10 uses the data line layer 14 as the lower electrode and the conductive glass layer 15 as the upper electrode, so the data line layer 14 makes the multi-function effective. Therefore, when the light sensor 10 senses the degree of darkness of the outside light, the display device can be self-adjusted accordingly, get more adaptable to the external environment display contrast, and improve the display effect.

In another embodiment, the light sensor 10 comprises a light-sensitive high-concentration doped N-type amorphous silicon layer 11 (N+α-Si), a light-sensitive amorphous silicon layer 12 (α-Si), and a light-sensitive high-concentration doped P-type amorphous silicon layer 13 (P+α-Si) from top to bottom. In this case, the light sensor 10 is actually a PIN photodiode in which the PN junction of the photodiode is doped with an N-type semiconductor (i.e., a high concentration of N-type amorphous silicon doped as described herein), so that when the light sensor 10 senses changes of light intensity, the corresponding electrical signal will change, and the change of the electrical signal can be collected and analyzed; thus, the display panel 100 will be able to perceive the ambient light and shade and accordingly adjust the display contrast to improve the display effect and to enhance the viewing experience.

In another embodiment, a source electrode 25 and a drain electrode 26 are disposed on the transistor high concentration doped N-type amorphous silicon layer 24, and the top of the transistor 20 is covered by a passivation layer 27. In this case, the passivation layer 27 is provided on the transistor 20 to separate from the other portions of the first substrate 30 to avoid mutual influence and cause unnecessary problems; wherein the passivation layer 27 may be a gate insulating layer or other suitable materials.

Figure 2:
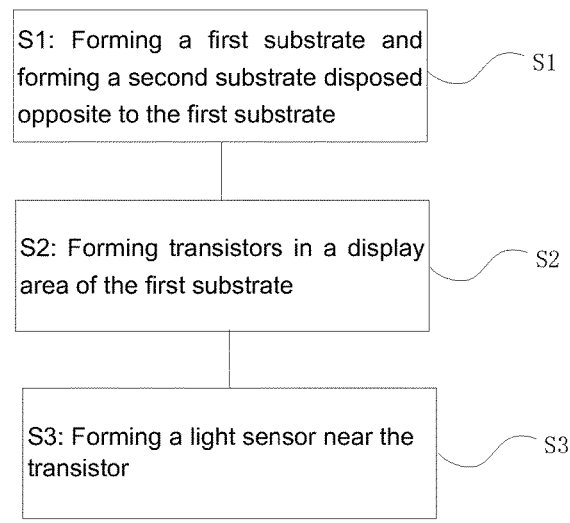
FIG. 2 is a process diagram of manufacturing a display panel in the present invention.

Referring to FIG. 2, which is a process diagram of manufacturing a display panel in the present invention, and also referring to FIG. 1, the present application also discloses a method for manufacturing a display panel, comprising: Step 1: forming a first substrate and forming a second substrate disposed opposite to the first substrate; Step 2: forming a plurality of transistors in a display area of the first substrate; and Step 3: forming a light sensor adjacent to the transistors.

With increasing demand for the display of the actual panel by the viewer, the beneficial effect of the present application is that the application has improved the display panel by making a display panel has a capability of self-regulation. Specifically, since the light sensor is provided correspondingly in the display area of the first substrate, the outside environment of the display area can be sensed by the light sensor, and in particular, it is possible to perceive the change in the intensity of the outside light. In this way, when the light is strong, a monitor can automatically adjust to improve the brightness and enhance the contrast to avoid the display screen is too dark; on weak light, the monitor can automatically adjust to reduce the brightness and reduce the contrast to avoid the picture is too bright; so, the display panel can be better, more intelligent to adjust display contrast and to display, effectively enhance the audience's viewing experience. Moreover, in this application, the light sensor is disposed between the transistors, so the space efficiency of the substrate can be improved.

In another embodiment, forming a transistor of the plurality of transistors in a display area of the first substrate further comprises: forming a gate, a gate insulating layer, a transistor amorphous silicon layer, and a transistor high concentration doped N-type amorphous silicon layer from bottom to top. The step of forming a light sensor adjacent to the transistors comprises forming a light sensor on an extension of the gate insulating layer. In this case, the light sensor is provided on the outside of the transistor, and the gate insulating layer is used for insulating spaced apart from the extension to avoid the influence of the electrical signal at the optical light sensor on the transistor; thus, this setting improves the efficiency of space and reduce the waste of space.

In another embodiment, the step of forming a light sensor on an extension of the gate insulating layer further comprises: forming a data line layer on the extension of the gate insulating layer; and forming the light sensor on the data line layer. In this case, the light sensor uses the data line layer as the lower electrode and the conductive glass layer as the upper electrode, so the data line layer makes the multi-function effective. Therefore, when the light sensor senses the degree of darkness of the outside light, the display device can be self-adjusted accordingly, get more adaptable to the external environment display contrast, and improve the display effect.

In another embodiment, the step of forming a light sensor adjacent to the transistors further comprises: forming a light-sensitive high-concentration doped N-type amorphous silicon layer, a light-sensitive amorphous silicon layer, and a light-sensitive high-concentration doped P-type amorphous silicon layer from top to bottom. In this case, the light sensor is actually a PIN photodiode in which the PN junction of the photodiode is doped with an N-type semiconductor (i.e., a high concentration of N-type amorphous silicon doped as described herein), so that when the light sensor senses changes of light intensity, the corresponding electrical signal will change, and the change of the electrical signal can be collected and analyzed; thus, the display device will be able to perceive the ambient light and shade and accordingly adjust the display contrast to improve the display effect and to enhance the viewing experience. Moreover, a passivation layer is provided on the transistor to separate from the other portions of the first substrate to avoid mutual influence and cause unnecessary problems; wherein the passivation layer may be a gate insulating layer or other suitable materials.

In another embodiment, the step of forming a transistor of the plurality of transistors in a display area of the first substrate comprises: forming a source electrode and a drain electrode on the transistor high concentration doped N-type amorphous silicon layer; and covering a passivation layer on the transistor of the plurality of transistors.

Figure 3:
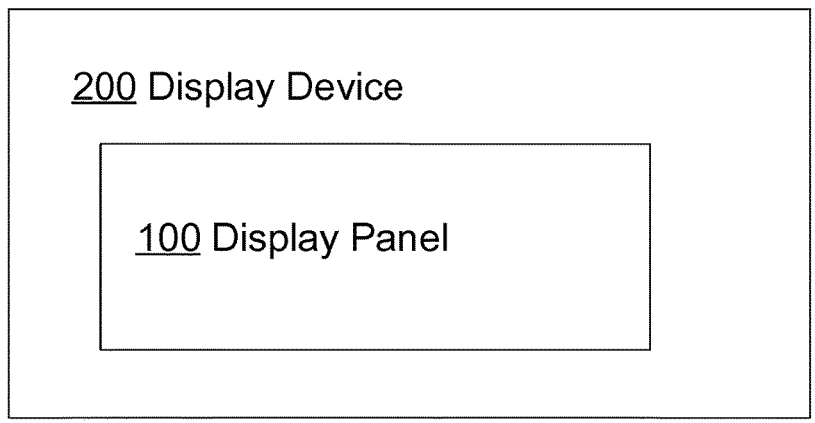
FIG. 3 is a schematic diagram of a display device in the present application.
Figure 4:
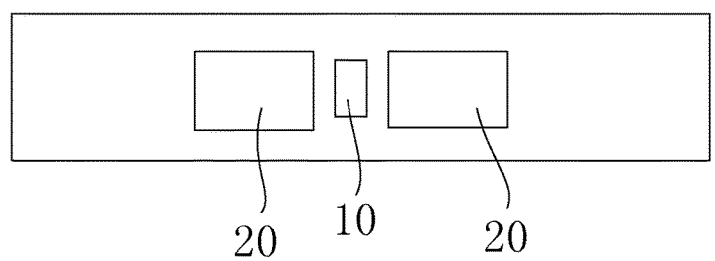
FIG. 4 is a schematic diagram showing a light sensor is disposed between a plurality of transistors in the disclosure.

Referring to FIG. 3, which is a schematic diagram of a display device in the present application, also referring to FIG. 1 and FIG. 2, the present application also discloses a display device 200 which includes the display panel 100 of the present application.

With increasing demand for the display of the actual panel by the viewer, the beneficial effect of the present application is that the application has improved the display panel by making a display panel has a capability of self-regulation. Specifically, since the light sensor is provided correspondingly in the display area of the first substrate, the outside environment of the display area can be sensed by the light sensor, and in particular, it is possible to perceive the change in the intensity of the outside light. In this way, when the light is strong, the monitor can automatically adjust to improve the brightness and enhance the contrast to avoid the display screen is too dark; on weak light, the monitor can automatically adjust to reduce the brightness and reduce the contrast to avoid the picture is too bright; thus, the display device can be better, more intelligent adjustment display contrast and display, effectively enhance the audience's viewing experience. Moreover, in this application, the light sensor is disposed between the transistors, so the space efficiency of the substrate can be improved.

Although a few embodiments of the present invention have been shown and described, it would be appreciated by those skilled in the art that changes may be made in this embodiment without departing from the principles and spirit of the invention, the scope of which is defined in the claims and their equivalents.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A display panel, comprising
a first substrate comprising a display area and a non-display area, wherein the display area includes a plurality of transistors and a light sensor adjacent to the plurality of transistors;
a second substrate disposed opposite to the first substrate;
wherein a transistor of the plurality of transistors comprises a gate, a gate insulating layer, a transistor amorphous silicon layer, and a transistor high-concentration doped N-type amorphous silicon layer from bottom to top; the gate insulating layer extends outwardly, and the light sensor is disposed on an extension of the gate insulating layer;
wherein a data line layer is disposed on the extension of the gate insulating layer; the light sensor is disposed on the data line layer; the top of the light sensor is covered with a conductive glass layer;
wherein the light sensor comprises a light-sensitive high-concentration doped N-type amorphous silicon layer, a light-sensitive amorphous silicon layer, and a light-sensitive high-concentration doped P-type amorphous silicon layer from top to bottom; and
wherein the transistor of the plurality of transistors further comprises a source electrode and a drain electrode disposed on the transistor high concentration doped N-type amorphous silicon layer; and the transistor of the plurality of transistors is covered by a passivation layer;
wherein the light sensor is disposed between the plurality of transistors and is separated from the transistor of the plurality of transistors through the passivation layer;
wherein the light sensor uses the data line layer as a lower electrode and the conductive glass layer as an upper electrode.

2. The display panel of claim 1, wherein the passivation layer is covered on the source electrode, the drain electrode and portions of the transistor high-concentration doped N-type amorphous silicon layer.

3. A display panel, comprising:
a first substrate comprising a display area and a non-display area, wherein the display area includes a plurality of transistors and a light sensor adjacent to the plurality of transistors; and
a second substrate disposed opposite to the first substrate;
wherein a transistor of the plurality of transistors comprises a gate, a gate insulating layer, a transistor amorphous silicon layer, and a transistor high-concentration doped N-type amorphous silicon layer from bottom to top;
wherein a data line layer is disposed on an extension of the gate insulating layer; the light sensor is disposed on the data line layer; the top of the light sensor is covered with a conductive glass layer; and the transistor of the plurality of transistors is covered by a passivation layer;
wherein the light sensor is disposed between the plurality of transistors and is separated from the transistor of the plurality of transistors through the passivation layer;
wherein the light sensor uses the data line layer as a lower electrode and the conductive glass layer as an upper electrode.

4. The display panel of claim 3,
wherein the gate insulating layer extends outwardly thereby forming the extension of the gate insulating layer.

5. The display panel of claim 4, wherein the light sensor comprises a light-sensitive high-concentration doped N-type amorphous silicon layer, a light-sensitive amorphous silicon layer, and a light-sensitive high-concentration doped P-type amorphous silicon layer from top to bottom.

6. The display panel of claim 4, wherein the transistor of the plurality of transistors further comprises a source electrode and a drain electrode disposed on the transistor high concentration doped N-type amorphous silicon layer.

7. The display panel of claim 6, wherein the passivation layer is covered on the source electrode, the drain electrode and portions of the transistor high-concentration doped N-type amorphous silicon layer.

8. A display panel manufacturing method, comprising
forming a first substrate and forming a second substrate disposed opposite to the first substrate;
forming a plurality of transistors in a display area of the first substrate; and
forming a light sensor adjacent to the plurality of transistors;
wherein forming a transistor of the plurality of transistors in a display area of the first substrate comprises:
forming a gate, a gate insulating layer, a transistor amorphous silicon layer, and a transistor high-concentration doped N-type amorphous silicon layer from bottom to top;
wherein a passivation layer is formed on the transistor of the plurality of transistors;
wherein the light sensor is formed on an extension of the gate insulating layer, the light sensor is disposed between the plurality of transistors and is separated from the transistor of the plurality of transistors through the passivation layer;
wherein the step of forming a light sensor adjacent to the plurality of transistors comprises:
forming a data line layer on the extension of the gate insulating layer;
forming a light-sensitive high-concentration doped N-type amorphous silicon layer, a light-sensitive amorphous silicon layer, and a light-sensitive high-concentration doped P-type amorphous silicon layer of the light sensor on the data line layer from top to bottom; and
forming a conductive glass layer on the light-sensitive high-concentration doped N-type amorphous silicon layer of the light sensor;
wherein the light sensor uses the data line layer as a lower electrode and the conductive glass layer as an upper electrode.

9. The display panel manufacturing method of the claim 8, wherein the step of forming a transistor of the flail plurality of transistors in a display area of the first substrate further comprises
forming a source electrode and a drain electrode on the transistor high concentration doped N-type amorphous silicon layer.

10. The display panel manufacturing method of the claim 9, wherein the passivation layer is covered on the source electrode, the drain electrode and portions of the transistor high-concentration doped N-type amorphous silicon layer.

* * * * *